(12) United States Patent
Doerr

(10) Patent No.: US 6,708,127 B2
(45) Date of Patent: Mar. 16, 2004

(54) BEAM PROPAGATION METHOD FOR STEP-INDEX WAVEGUIDES

(75) Inventor: Christopher Richard Doerr, Middletown, NJ (US)

(73) Assignee: Lucent Technologies Inc., Murray Hill, NJ (US)

(*) Notice: Subject to any disclaimer, the term of this patent is extended or adjusted under 35 U.S.C. 154(b) by 357 days.

(21) Appl. No.: 09/809,123

(22) Filed: Mar. 15, 2001

(65) Prior Publication Data

US 2002/0165682 A1 Nov. 7, 2002

(51) Int. Cl.$^7$ ............................................. G01R 23/16
(52) U.S. Cl. ........................................ 702/77; 356/73.1
(58) Field of Search .............................. 702/66, 69, 72, 702/74, 76–77, 189; 356/73.1, 150–152.3; 250/573–574; 385/129–132, 14

(56) References Cited

U.S. PATENT DOCUMENTS

| | | | | |
|---|---|---|---|---|
| 5,629,992 A | * | 5/1997 | Amersfoort et al. | 385/15 |
| 5,880,838 A | * | 3/1999 | Marx et al. | 356/498 |
| 5,917,981 A | * | 6/1999 | Kovacic et al. | 385/131 |
| 6,304,706 B1 | * | 10/2001 | Sugita et al. | 385/129 |

OTHER PUBLICATIONS

Rohrbach et al., "Scattering of a Scalar Field at Dielectric Surfaces by Born Series Expansion", Oct. 1998, Optical Society of America, vol. 15 No. 10, pp. 2651–2659.*
Paterson et al., "Excimer Laser Ablation of Microstructures: A Numerical Model", Dec. 1999, Journal of Applied Physics, vol. 86 No. 11, pp. 6538–6546.*
Katsunari Okamoto, "Beam Propagation Method," Fundamentals of Optical Waveguides, Chapter 7, 273–281 (2000).
C. R. Doerr, "Beam Propagation Method Tailored for Step–Index Waveguides," IEEE Photonics Technology Letters, vol. 13. No. 2, 130–132 (Feb., 2001).

* cited by examiner

Primary Examiner—Marc S. Hoff
Assistant Examiner—Mary Catherine Baran

(57) ABSTRACT

A method and apparatus are disclosed for simulating planar waveguides having a rectangular cross-section using a beam propagation method and design tool based on the FFT-BPM. Constraining the beam propagation method to planar waveguides having rectangular cross-sections significantly reduces the computational complexity and increases accuracy. The beam propagation method can be performed entirely in the angular spectrum domain. The constrained shape of the waveguide allows the structure to be accurately specified by its width and center-to-center arm spacing, thereby avoiding transverse spatial quantization.

17 Claims, 4 Drawing Sheets

300

```
#include <math.h>
#include "mex.h"
#define PI 3.14159265358979
void mexFunction (int nlhs, mxArray *plhs[], int nrhs, const mxArray *prhs[]) {
    double Dlocd, Dkx, Dz, k, ampr, ampi, Dnn, mult1, mult2, tempd, xlimit, Dx, kx;
    double temp1, temp2, *ufr, *ufi, *ufnewr, *ufnewi, *tfr, *tfi, *w, *aa, *d;
    short Dloc, loc, h, temp, N, imp, QN1, QN3, lim, numsteps, cnt;

ufr = mxGetPr(prhs[0]);            /* real part of FT of input field */
    ufi = mxGetPi(prhs[0]);            /* imag part of FT of input field */
    N = mxGetN(prhs[0]);               /* number of points */
    xlimit = mxGetScalar(prhs[1]);     /* window size: -xlim to +xlim */
    Dz = mxGetScalar(prhs[2]);         /* z step size */
    k = mxGetScalar(prhs[3]);          /* propagation const. in cladding */
    w = mxGetPr(prhs[4]);              /* array of width w vs. z */
    numsteps = mxGetN(prhs[4]);        /* number of z steps */
    aa = mxGetPr(prhs[5]);             /* array of period a vs. z */
    Dnn = mxGetScalar(prhs[6]);        /* normalized effective index step */
    d = mxGetPr(prhs[7]);              /* array of spatial shift d vs. z */ plhs[0] = mxCreateDoubleMatrix(1, N, mxCOMPLEX);
    ufnewr = mxGetPr(plhs[0]);         /* real part of FT of output field */
    ufnewi = mxGetPi(plhs[0]);         /* imag part of FT of output field */
    plhs[1] = mxCreateDoubleMatrix (1, N, mxCOMPLEX);
    tfr = mxGetPr(plhs[1]);            /* real part of angular dispersion */
    tfi = mxGetPi(plhs[1]);            /* imag part of angular dispersion */
    QN1 = N/4;                         /* lower limit of convolution */
    QN3 = 3*N/4;                       /* upper limit of convolution */
    Dx = 2*xlimint/N;                  /* x grid size */
    Dkx = 2*PI/Dx/N;                   /* kx grid size */
    mult1 = sin(k*Dz*Dnn);

mult2 = (cos(k*Dz*Dnn) - 1);
```

FIG. 3A

```
for (h = 0; h < N; h++) {                    /* calculate angular dispersion */
        kx = -PI/Dx + Dkx*h;
        temp = k*k - kx*kx;
        if (temp > 0) {
                tfr[h] = cos(sqrt(tempd) * Dz);
                tfi[h] = sin(sqrt(tempd) * Dz);
        } else {
                tfr[h] = exp(-sqrt(-tempd) * Dz);
                tfi[h] = 0;
        }
}
for (h = 0; h < N; h++) {                    /* initialize ufnew */
        ufnewr[h] = ufr[h];
        ufnewi[h] = ufi[h];
} for (cnt = 0; cnt < numsteps; cnt++) {       /* main loop */
        for (h = 0; h < N; h++) {            /* angular dispersion part */
                ufr[h] = ufnewr[h] * tfr[h] - ufnewi[h] * tfi[h];
                ufi[h] = ufnewi[h] * tfr[h] + ufnewr[h] * tfi[h];
                ufnewr[h] = ufr[h];
                ufnewi[h] = ufi[h];
        }
        lim = (short)(k * aa[cnt]/26);       /* field distortion part */
        Dlocd = 2*PI/aa[cnt]/Dkx;
        for (imp = -lim; imp < lim + 1; imp++) {
                loc = (short) Dlocd * imp;
                if (imp ! = 0) {
                        ampr = sin(w[cnt] * Dkx * loc/2)/(PI * imp);
                } else {
                        ampr = w[cnt]/aa[cnt];
                }
                temp1 = cos(d[cnt] * Dkx * loc);   /* + cos(d2[cnt] * Dkx * loc) ... */
                temp2 = sin(d[cnt] * Dkx * loc);   /* +sin(d2[cnt] * Dkx * loc) ... */
                ampi = apmr * (mult1 * temp1 + mult2 * temp2);
                ampr = ampr * (mult2 * temp1 - mult1 * temp2);
                for (h = QN1; h < QN3; h++) {      /* perform a convolution */
                        temp = h - loc;
                        if (temp < 0) temp = temp + N;
                        if (temp > N - 1) temp = temp - N;
                        ufnewr[h] = ufnewr[h] + ufr[temp] * ampr - ufi[temp] * ampi;
                        ufnewi[h] = ufnewi[h] + ufr[temp] * ampi + ufi[temp] * ampr;
                }
        }
}
return; }
```

FIG. 3B

BEAM PROPAGATION METHOD FOR STEP-INDEX WAVEGUIDES

FIELD OF THE INVENTION

The present invention relates to beam propagation method and, more particularly, to a method and apparatus for designing planar lightwave circuits using beam propagation methods.

BACKGROUND OF THE INVENTION

Planar lightwave circuits are well-suited for mass production of optical filters and switches. Planar lightwave circuits, such as step-index waveguides, typically consist of a substrate, a uniform lower cladding, a core that varies discretely in two dimensions, and a uniform upper cladding. Beam propagation methods (BPM) are utilized to investigate lightwave propagation through simulated planar lightwave circuits. For a review of general beam propagation methods, see, for example, K. Okamoto, Fundamentals of Optical Waveguides, Chapter 7, Academic Press (2000), incorporated by reference herein. The two most popular beam propagation methods used in the design of planar lightwave circuits are the split-step Fourier Transform beam propagation method, often referred to as the Fast Fourier Transform (FFT)-BPM, and the finite-difference beam propagation method (FD-BPM).

Generally, the FFT-BPM and FD-BPM both approximate a planar waveguide structure by plotting the index of refraction as a function of the spatial coordinates using a spatial grid. Thus, spatial quantization errors are introduced along the waveguide boundaries between the core and the cladding. In addition, the FFT-BPM and FD-BPM both permit simulation of planar lightwave circuits having an arbitrary index distribution, i.e., an arbitrary core cross section. In addition, the FFT-BPM continuously translates between the spatial domain and angular spectrum domain using Fourier transform techniques. Thus, these beam propagation methods have significant processing speed and memory capacity requirements. A need therefore exists for beam propagation methods with reduced computational complexity and spatial quantization errors.

SUMMARY OF THE INVENTION

Generally, a novel beam propagation method and design tool are disclosed that are based on the FFT-BPM. The present invention provides a beam propagation method that is constrained to planar waveguides having a rectangular cross-section, resulting in significantly reduced computational complexity and better accuracy. Among other benefits, the beam propagation method can be performed entirely in the angular spectrum domain, without translating back and forth to the spatial domain. In addition, the constrained shape of the waveguide allows the structure to be accurately specified by its width and center-to-center arm spacing, thereby avoiding transverse spatial quantization.

A more complete understanding of the present invention, as well as further features and advantages of the present invention, will be obtained by reference to the following detailed description and drawings.

BRIEF DESCRIPTION OF THE DRAWINGS

FIGS. 3A and 3B, collectively, illustrate exemplary pseudo-code for the planar waveguide design process of FIG. 2.

DETAILED DESCRIPTION

The present invention provides a new beam propagation method based on the FFT-BPM. The present invention recognizes that most planar waveguides have a rectangular cross-section. Thus, the present invention provides a beam propagation method that is constrained to rectangular cross-sections, resulting in significantly reduced computational complexity and better accuracy.

Conventional FFT-BPM Techniques

For a detailed discussion of FFT-BPM techniques, see, for example, K. Okamoto, Fundamentals of Optical Waveguides, Chapter 7, Academic Press (2000), incorporated by reference herein above. Generally, FFT-BPM techniques typically treat field distortion in the spatial domain due to refractive index variation and plane wave propagation in the angular domain separately for each small step in the propagation direction, z. For each step $\Delta z$, the complex field $u(x,y)$, where x and y are the transverse dimensions in the plane of the circuit, is initially multiplied by:

$$\exp[jk\Delta z \Delta n(x,y)/n]. \qquad (1)$$

where n is the cladding index, $\Delta n(x,y)$ equals $n(x,y)-n$, and k equals $2\pi n/(\text{wavelength})$. Then $u(x,y)$ is Fourier transformed to get the angular spectrum $U(k_x, k_y)$. For a discussion of angular spectrums, see, e.g., J. Goodman, Introduction to Fourier Optics, McGraw-Hill (1968). $U(k_x, k_y)$ is then multiplied by:

$$\exp(jk_z\Delta z)=\exp(j\sqrt{k^2-k_x^2-k_y^2}\Delta z). \qquad (2)$$

to represent the propagation of the lightwave in free space. The result is then inverse Fourier transformed, z is advanced by $\Delta z$, and the cycle repeats until the end of the propagation region.

While conventional FFT beam propagation methods continuously translate between the spatial domain and angular spectrum domain using Fourier transform techniques, the present invention recognizes that equation (1) can be Fourier transformed and convolved with the angular spectrum. As discussed further below, the beam propagation method of the present invention speeds up the computation for step-index waveguides and waveguide arrays, where it is easy to Fourier transform equation (1), and where equation (1) is periodic, respectively. In addition, the beam propagation method of the present invention avoids transverse spatial quantization. Thus, it is not necessary to keep an angular spectrum much larger than k, because fields decay exponentially outside of this range. The beam propagation method of the present invention avoids quantization errors by staying in the angular domain (there is some quantization of the impulses in the angular domain, but these are averaged out over many impulses in each step; when simulating non-periodic structures, i.e., when $\alpha$ is chosen to be so large that there is no mutual coupling, then even this quantization does not matter).

SINC Beam Propagation Method

Figure 1:
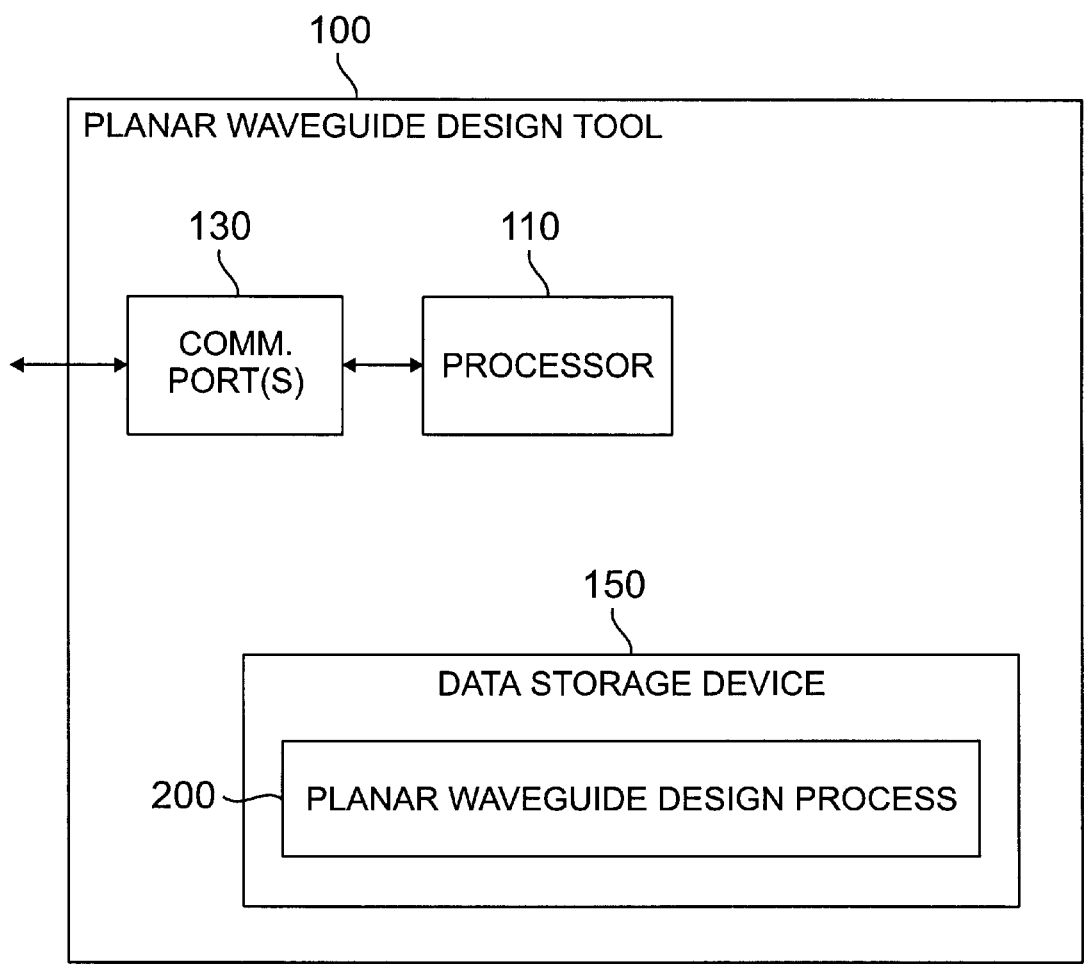
FIG. 1 is a schematic block diagram of an illustrative planar waveguide design tool in accordance with the present invention.

FIG. 1 is a schematic block diagram of an illustrative planar waveguide design tool 100 in accordance with the present invention. As shown in FIG. 1, the planar waveguide design tool 100 includes certain hardware components, such as a processor 110, a data storage device 130, and one or more optional communications ports 130. The processor 110 can be linked to each of the other listed elements, either by means of a shared data bus, or dedicated connections, as shown in FIG. 1. The communications port(s) 130 allow(s) the planar waveguide design tool 100 to communicate with other devices over a network (not shown).

The data storage device 120 is operable to store one or more instructions, discussed further below in conjunction with FIG. 2, which the processor 110 is operable to retrieve, interpret and execute in accordance with the present invention. As shown in FIG. 1, the data storage device 120 includes a planar waveguide design process 200 incorporating features of the present invention. Generally, the planar waveguide design process 200 simulates any planar lightwave circuit having a rectangular cross-section and investigates lightwave propagation through the simulated device.

As is known in the art, the methods discussed herein may be distributed as an article of manufacture that itself comprises a computer readable medium having computer readable code means embodied thereon. The computer readable program code means is operable, in conjunction with a computer system, to carry out all or some of the steps to perform the methods or create the apparatuses discussed herein. The computer readable medium may be a recordable medium (e.g., floppy disks, hard drives, compact disks, or memory cards) or may be a transmission medium (e.g., a network comprising fiber-optics, the world-wide web, cables, or a wireless channel using time-division multiple access, code-division multiple access, or other radio-frequency channel). Any medium known or developed that can store information suitable for use with a computer system may be used. The computer-readable code means is any mechanism for allowing a computer to read instructions and data, such as magnetic variations on a magnetic media or height variations on the surface of a compact disk.

Data storage device 120 will configure the processor 110 to implement the methods, steps, and functions disclosed herein. The data storage device 120 could be distributed or local and the processor could be distributed or singular. The data storage device 120 could be implemented as an electrical, magnetic or optical memory, or any combination of these or other types of storage devices. It should be noted that, although data storage device 120 is shown separately from other elements of the planar waveguide design tool 100, this is not necessarily the case for all applications. Moreover, the term "data storage device" should be construed broadly enough to encompass any information able to be read from or written to an address in the addressable space accessed by processor 110. With this definition, information on a network is still within data storage device 120 of the planar waveguide design tool 100 because the processor 100 can retrieve the information from the network.

Figure 2:
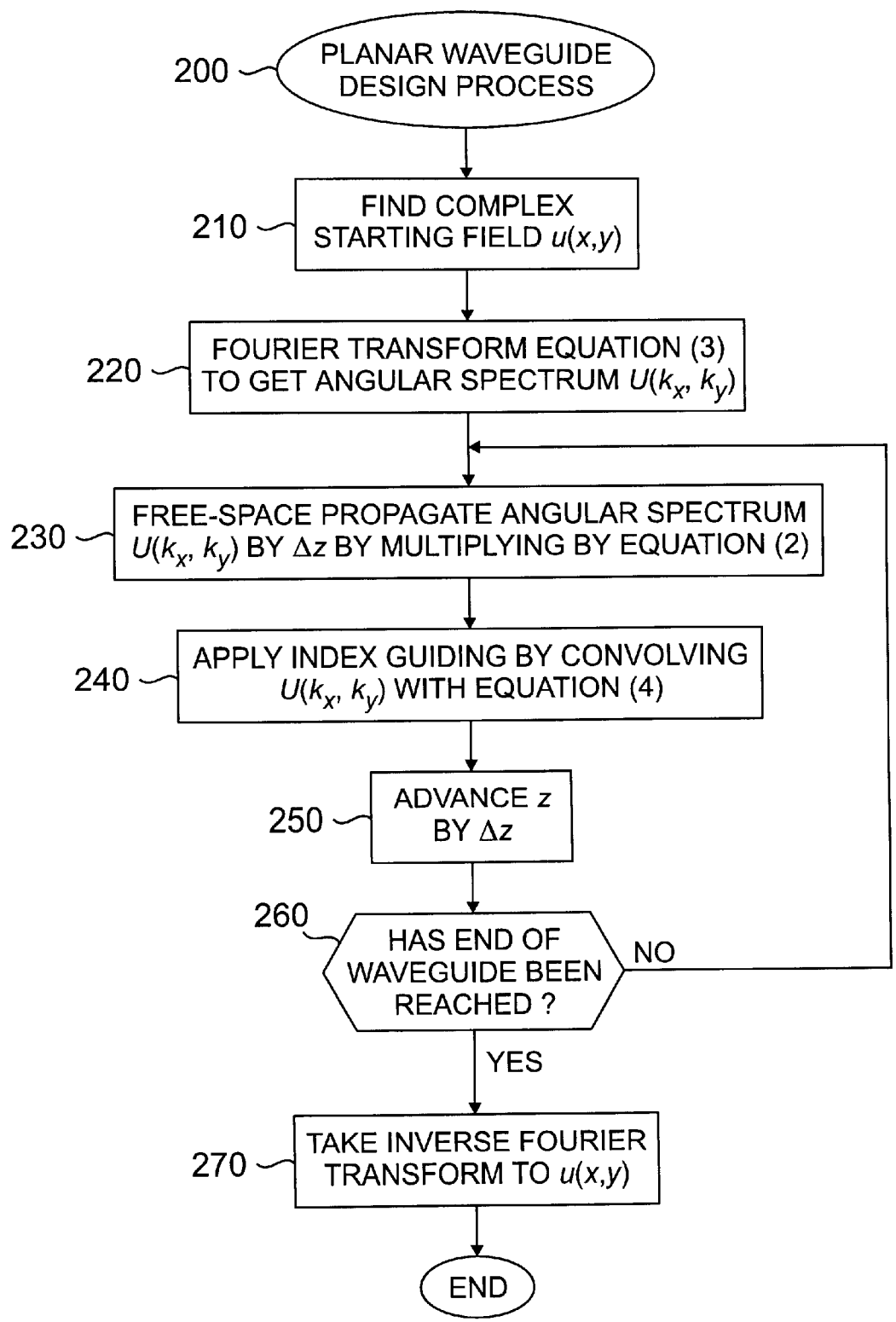
FIG. 2 is a flow chart describing an exemplary implementation of the planar waveguide design process of FIG. 1.

FIG. 2 is a flow chart describing an exemplary planar waveguide design process 200 incorporating features and functions of the present invention. As previously indicated, the planar waveguide design process 200 simulates any planar lightwave circuit having a rectangular cross-section and investigates lightwave propagation through the simulated device. Initially, the planar waveguide design process 200 finds the complex starting field u(x,y) during step 210.

Since the present invention considers step-index waveguides, waveguide arrays and other optical devices having a rectangular cross-section, equation (1) can be modified to be:

$$f(x,y)[\exp(jk\Delta z \Delta n/n)-1]+1 \qquad (3)$$

where f(x,y) is a function that is either 0 or 1, and $\Delta n$ is a constant. Any waveguide distribution can be expressed as a sum of waveguide arrays. Each waveguide array has a width w, period a, and offset (from origin) d. If there is only one waveguide, then a can be a distance at which the coupling between waveguides is negligible.

Equation (3) is Fourier transformed during step 220 to get the angular spectrum $U(k_x, k_y)$. The angular spectrum $U(k_x, k_y)$ is then propagated in free space during step 230 by one step, $\Delta z$ by multiplying by equation (2).

For each set of periodically spaced waveguides we get:

$$\delta(k_x, k_y) + [\exp(jk\Delta z \Delta n/n) - 1]\frac{w_x}{a_x}\frac{\sin(k_x w_x/2)}{k_x w_x/2}\exp\left(j2\pi\frac{d_x}{a_x}\right) \qquad (4)$$

$$\frac{w_y}{a_y}\frac{\sin(k_y w_y/2)}{k_y w_y/2}\exp\left(j2\pi\frac{d_y}{a_y}\right) \times \sum_{p,q}\delta\left(k_x - \frac{2\pi p}{a_x}, k_y - \frac{2\pi q}{a_y}\right)$$

During step 240, $U(k_x,k_y)$ is convolved with equation (4) (the sinc function) to represent a guiding function of the lightwave in a region of the planar lightwave circuit having a refractive index (instead of Fourier transforming it to translate between the spatial domain and angular spectrum domain as with conventional techniques). The angular spectrum $U(k_x, k_y)$ is then advanced during step 250 by one step, $\Delta z$. A test is performed during step 260 to determine if the end of the waveguide has been reached. If it is determined during step 260 that the end of the waveguide has not been reached, then program control returns to step 240 and continues in the manner described above.

If, however, it is determined during step 260 that the end of the waveguide has been reached, then the inverse fourier transform is performed during step 270 to obtain u(x,y), before program control terminates.

To further speed the computation, the sinc functions of equation (4) can be truncated during step 260 after $$k \cdot \frac{a}{2b}$$

terms from the center. Because of the truncation, the total power conservation is imperfect.

FIGS. 3A and 3B, collectively, illustrate exemplary pseudo-code 300 for the planar waveguide design process 200. The pseudo-code 300 of FIG. 3 is written as a subroutine in the C programming language. The input arguments are the Fourier transform of the initial field u(x,y); the window-size $2x_{lim}$ (which should equal $\sim N\pi/k$ for optimum speed); the step-size $\Delta z$; k; the index step $\Delta n/n$; and the waveguide width w, center-to-center spacing a, and displacement from the origin d as arrays containing their values for each step of $\Delta z$. To simulate non-periodic structures, e.g., evanescent couplers, the two lines in which temp1 and temp2 are assigned are modified.

Star Couplers

The star coupler, commonly used in waveguide gratings and lenses, consists of two planar arrays of diverging waveguides which have their convergence points on the other's termination in a planar free-space region. An efficient way to calculate the transmissivity from any waveguide on the one side of the star coupler to any waveguide on the other side of the star coupler is to first perform beam propagation in the waveguide array, starting from when the waveguides are uncoupled to when they reach the free-space region boundary, which has to be done only once, and then use an analytic calculation for the free-space propagation. Total power loss in the BPM is not important since the propagated mode can be renormalized and still provide accurate star-coupler transmissivities. Generally, the planar waveguide design process 200 can be iteratively employed to evaluate the lightwave propagation in the star coupler to ensure the desired power ratio at each output arm.

It is to be understood that the embodiments and variations shown and described herein are merely illustrative of the principles of this invention and that various modifications may be implemented by those skilled in the art without departing from the scope and spirit of the invention.

I claim:

1. A beam propagation method for analyzing a lightwave propagation through a simulated planar lightwave circuit, said method comprising the steps of:

defining a starting field that represents said lightwave;

representing said propagation of said lightwave in free space by multiplying by a phase term in an angular spectrum domain;

representing a guiding function of said lightwave in a region of said planar lightwave circuit having a refractive index distribution by convolving with impulse functions in an angular spectrum domain; and repeating each of said representing steps for each of a plurality of forward propagation increments.

2. The beam propagation method of claim 1, wherein said planar lightwave circuit has a rectangular cross-section.

3. The beam propagation method of claim 1, wherein said phase term can be expressed as:

$$\exp(jk_z\Delta z)=\exp(j\sqrt{k^2-k_{x^2-k_y}}\Delta z)$$

where $\Delta z$ is a step size, x and y are transverse dimensions in a plane of said circuit, and k equals $2\pi n/$(wavelength).

4. The beam propagation method of claim 1, wherein said second representing step further comprises the step of convolving said angular spectrum, $U(k_x, k_y)$, with:

$$\delta(k_x, k_y) + [\exp(jk\Delta z\Delta n/n) - 1]\frac{w_x}{a_x}\frac{\sin(k_x w_x/2)}{k_x w_x/2}\exp\left(j2\pi\frac{d_x}{a_x}\right)$$
$$\frac{w_y}{a_y}\frac{\sin(k_y w_y/2)}{k_y w_y/2}\exp\left(j2\pi\frac{d_y}{a_y}\right)\times\sum_{p,q}\delta\left(k_x - \frac{2\pi p}{a_x}, k_y - \frac{2\pi q}{a_y}\right)$$

where $\Delta z$ is a step size, x and y are transverse dimensions in a plane of said circuit, $\Delta n(x,y)$ equals $n(x,y)-n$, k equals $2\pi n/$(wavelength) and said planar lightwave circuit has a width w, period a, and offset (from origin) d.

5. A beam propagation method for analyzing a lightwave propagation through a simulated planar lightwave circuit, said method comprising the steps of:

defining a structure of said planar lightwave circuit in an angular spectrum domain; and analyzing said lightwave propagation through a simulated planar lightwave circuit entirely in said angular spectrum domain wherein said lightwave propagation in free space can be represented by multiplying by a phase term in an annular spectrum domain.

6. The beam propagation method of claim 5, wherein said defining step requires said planar lightwave circuit to have a rectangular cross-section.

7. The beam propagation method of claim 5, wherein said phase term can be expressed as:

$$\exp(jk_z\Delta z)=\exp(j\sqrt{k^2-k_{x^2-k_y}}\Delta z)$$

where $\Delta z$ is a step size, x and y are transverse dimensions in a plane of said circuit, and k equals $2\pi n/$(wavelength).

8. The beam propagation method of claim 5, wherein a guiding function of said lightwave in a region of said planar lightwave circuit having a refractive index distribution can be represented by convolving impulse functions in an angular spectrum domain.

9. The beam propagation method of claim 8, wherein said impulse functions can be represented as:

$$\delta(k_x, k_y) + [\exp(jk\Delta z\Delta n/n) - 1]\frac{w_x}{a_x}\frac{\sin(k_x w_x/2)}{k_x w_x/2}\exp\left(j2\pi\frac{d_x}{a_x}\right) \quad (4)$$
$$\frac{w_y}{a_y}\frac{\sin(k_y w_y/2)}{k_y w_y/2}\exp\left(j2\pi\frac{d_y}{a_y}\right)\times\sum_{p,q}\delta\left(k_x - \frac{2\pi p}{a_x}, k_y - \frac{2\pi q}{a_y}\right)$$

where $\Delta z$ is a step size, x and y are transverse dimensions in a plane of said circuit, $\Delta n(x,y)$ equals $n(x,y)-n$, k equals $2\pi n/$(wavelength) and said planar lightwave circuit has a width w, period a, and offset (from origin) d.

10. A beam propagation method for analyzing a lightwave propagation through a simulated planar lightwave circuit, said method comprising the steps of:

defining a structure of said planar lightwave circuit in an angular spectrum domain; and analyzing said lightwave propagation in an angular spectrum domain at a plurality of steps along a length of said simulated planar lightwave circuit by dispersing an angular spectrum of said lightwave to represent said propagation of said lightwave in free space and convolving said angular spectrum with a Fourier transform of a spatial index distribution to represent a guiding function of said lightwave in a region of said planar lightwave circuit having a refractive index.

11. The beam propagation method of claim 10, wherein said defining step requires said planar lightwave circuit to have a rectangular cross-section.

12. The beam propagation method of claim 10, wherein said propagation of said lightwave in free space can be represented by multiplying by a phase term in an angular spectrum domain.

13. The beam propagation method of claim 12, wherein said phase term can be expressed as:

$$\exp(jk_z\Delta z)=\exp(j\sqrt{k^2-k_{x^2-k_y}}\Delta z)$$

where $\Delta z$ is a step size, x and y are transverse dimensions in a plane of said circuit, and k equals $2\pi n/$(wavelength).

14. The beam propagation method of claim 10, wherein said spatial index distribution can be represented as:

$$\delta(k_x, k_y) + [\exp(jk\Delta z\Delta n/n) - 1]\frac{w_x}{a_x}\frac{\sin(k_x w_x/2)}{k_x w_x/2}\exp\left(j2\pi\frac{d_x}{a_x}\right) \quad (4)$$
$$\frac{w_y}{a_y}\frac{\sin(k_y w_y/2)}{k_y w_y/2}\exp\left(j2\pi\frac{d_y}{a_y}\right)\times\sum_{p,q}\delta\left(k_x - \frac{2\pi p}{a_x}, k_y - \frac{2\pi q}{a_y}\right)$$

where $\Delta z$ is a step size, x and y are transverse dimensions in a plane of said circuit, $\Delta n(x,y)$ equals $n(x,y)-n$, k equals $2\pi n/$(wavelength) and said planar lightwave circuit has a width w, period a, and offset (from origin) d.

15. A system for analyzing a lightwave propagation through a simulated planar lightwave circuit, said system comprising:

a memory that stores computer-readable code; and a processor operatively coupled to said memory, said processor configured to implement said computer-readable code, said computer-readable code configured to:

define a starting field that represents said lightwave;

represent said propagation of said lightwave in free space by multiplying by a phase term in an angular spectrum domain;

represent a guiding function of said lightwave in a region of said planar lightwave circuit having a refractive index distribution by convolving impulse functions in an angular spectrum domain; and repeat each of said representations for each of a plurality of forward propagation increments.

16. A system for analyzing a lightwave propagation through a simulated planar lightwave circuit, said system comprising:

a memory that stores computer-readable code; and a processor operatively coupled to said memory, said processor configured to implement said computer-readable code, said computer-readable code configured to:

define a structure of said planar lightwave circuit in an angular spectrum domain; and analyze said lightwave propagation through a simulated planar lightwave circuit entirely in said angular spectrum domain wherein said lightwave propagation in free space can be represented by multiplying by a phase term in an angular spectrum domain.

17. A system for analyzing a lightwave propagation through a simulated planar lightwave circuit, said system comprising:

a memory that stores computer-readable code; and a processor operatively coupled to said memory, said processor configured to implement said computer-readable code, said computer-readable code configured to:

define a structure of said planar lightwave circuit in an angular spectrum domain; and analyze said lightwave propagation in an angular spectrum domain at a plurality of steps along a length of said simulated planar lightwave circuit by dispersing an angular spectrum of said lightwave to represent said propagation of said lightwave in free space and convolving said angular spectrum with a Fourier transform of a spatial index distribution to represent a guiding function of said lightwave in a region of said planar lightwave circuit having a refractive index.

* * * * *

UNITED STATES PATENT AND TRADEMARK OFFICE
CERTIFICATE OF CORRECTION

PATENT NO. : 6,708,127 B2
DATED : March 16, 2004
INVENTOR(S) : Christopher R. Doerr It is certified that error appears in the above-identified patent and that said Letters Patent is hereby corrected as shown below:

Column 2,
Line 38, should be changed to read as:

$$-- \exp(jk_z \Delta z) = \exp(j\sqrt{k^2 - k_x^2 - k_y^2} \Delta z) \qquad (2) --.$$

Column 5,
Line 37, replace "$\exp(jk_z \Delta z) = \exp(j\sqrt{k^{2-k_x^2-k_y}} \Delta z)$" with $$-- \exp(jk_z \Delta z) = \exp(j\sqrt{k^2 - k_x^2 - k_y^2} \Delta z) --.$$

Line 64, after "an" and before "spectrum" replace "annular" with -- angular --.

Column 6,
Line 4, replace "$\exp(jk_z \Delta z) = \exp(j\sqrt{k^{2-k_x^2-k_y}} \Delta z)$" with $$-- \exp(jk_z \Delta z) = \exp(j\sqrt{k^2 - k_x^2 - k_y^2} \Delta z) --.$$

Line 48, replace "$\exp(jk_z \Delta z) = \exp(j\sqrt{k^{2-k_x^2-k_y}} \Delta z)$" with $$-- \exp(jk_z \Delta z) = \exp(j\sqrt{k^2 - k_x^2 - k_y^2} \Delta z) --.$$

Line 62, before "equals" and after "circuit," replace "An(x,y)" with -- Δn(x,y) --.

Signed and Sealed this

Sixth Day of September, 2005

JON W. DUDAS
*Director of the United States Patent and Trademark Office*